(12) United States Patent
Miyaki et al.

(10) Patent No.: US 7,211,903 B2
(45) Date of Patent: May 1, 2007

(54) SEMICONDUCTOR DEVICE AND MANUFACTURING METHOD OF THEM

(75) Inventors: Yoshinori Miyaki, Musashimurayama (JP); Kazunari Suzuki, Ota (JP); Hirohito Ohashi, Fuchu (JP)

(73) Assignee: Renesas Technology Corp., Tokyo (JP)

( * ) Notice: Subject to any disclaimer, the term of this patent is extended or adjusted under 35 U.S.C. 154(b) by 338 days.

(21) Appl. No.: 11/005,217

(22) Filed: Dec. 7, 2004

(65) Prior Publication Data
US 2005/0162880 A1 Jul. 28, 2005

(30) Foreign Application Priority Data
Dec. 26, 2003 (JP) ............................. 2003-433851

(51) Int. Cl.
- *H01L 23/48* (2006.01)
- *H01L 23/52* (2006.01)
- *H01L 23/40* (2006.01)

(52) U.S. Cl. .................. 257/784; 257/786; 257/773
(58) Field of Classification Search ................ 257/784, 257/786, 777, 773, 775, 776
See application file for complete search history.

(56) References Cited

U.S. PATENT DOCUMENTS

| | | | |
|---|---|---|---|
| 6,476,506 B1 * | 11/2002 | O'Connor et al. | 257/786 |
| 6,534,879 B2 * | 3/2003 | Terui | 257/786 |
| 2004/0004278 A1 * | 1/2004 | Cheng et al. | 257/690 |
| 2005/0012226 A1 * | 1/2005 | Chang et al. | 257/784 |
| 2005/0029649 A1 * | 2/2005 | Kuzawinski et al. | 257/698 |
| 2005/0184403 A1 * | 8/2005 | Inagawa | 257/784 |
| 2006/0055062 A1 * | 3/2006 | Ohta | 257/784 |
| 2006/0192300 A1 * | 8/2006 | Appel et al. | 257/784 |
| 2006/0197234 A1 * | 9/2006 | Pape | 257/784 |

FOREIGN PATENT DOCUMENTS

JP 2001-244293 9/2001

* cited by examiner

*Primary Examiner*—S. V. Clark
(74) *Attorney, Agent, or Firm*—Miles & Stockbridge PC

(57) ABSTRACT

A semiconductor device which can meet the requirement for a further increase in pins, which multi-functionalization and faster operation would entail is to be provided. Bonding pads and bonding pads are arranged in a zigzag pattern in a direction along an outer circumference of a main surface of a chip. To focus on power supply-line bonding pads among all the bonding pads, an odd number of bonding pads are to be arranged in a direction of the outer circumference of the main surface between adjoining bonding pads. A greater width is secured for the power supply-line bonding pads than for other bonding pads, and a diameter of wires to be connected to the power supply-line bonding pads is set greater than that of other wires.

12 Claims, 10 Drawing Sheets

SEMICONDUCTOR DEVICE AND MANUFACTURING METHOD OF THEM

CROSS-REFERENCE TO RELATED APPLICATION

The present application claims priority from Japanese patent application No. 2003-433851 filed on Dec. 26, 2003, the content of which is hereby incorporated by reference into this application.

BACKGROUND OF THE INVENTION

The present invention relates to a semiconductor device and a technique of manufacturing it, and more particularly to a technique that can be effectively applied to a semiconductor device on whose wiring board a semiconductor chip is mounted.

For instance, there is a technique to increase the freedom of electrode arrangement on the main surface of the semiconductor device by arranging a plurality of electrodes (pads) in a zigzag pattern on the main surface of a semiconductor device and providing power supply electrodes and grounding electrodes extending along the sides constituting the main surface and arranged in a frame shape surrounding the central part of the semiconductor device. This makes it possible to cope with an increase in the number of electrodes (use of multiple pins) along with the functional sophistication of semiconductor devices and a reduction in semiconductor device size (see Patent Reference 1 for instance)

Patent Reference 1: Japanese Unexamined Patent Publication No. 2001-244293

SUMMARY OF THE INVENTION

In recent years, semiconductor devices are increasingly required to be functionally more sophisticated and to operate faster, and to meet these requirements an increasingly large number of pins are used for pads arranged on the main surfaces of semiconductor chips (hereinafter referred to as simply chip(s)). The present inventors, studying semiconductor devices having such multi-pin semiconductor chips, identified the following problems.

Thus, in a semiconductor device studied by the inventors, power supply and grounding pads are designed to the same specification (size) as pads for other signal input/output lines, and the bonding wires connected to these pads are also of the same thickness. Since power supply and grounding lines require larger current capacities than those of other signal input/output lines, power supply and grounding pads and bonding wires connected to them should be reduced in resistance compared with other signal input/output pads and bonding wires connected to them. To meet this need, the numbers of power supply pads and grounding pads have to be further increased, and this would entail a corresponding increase in the number of bonding wires connected to them. This entails a problem of a further advance in the increase of pins and a corresponding enlargement of chip size.

Further in the semiconductor device studied by the inventors, pads are arrayed in a single row along the outer circumference of the main surface of the chip. In order to increase the number of pins disposed on such a semiconductor device without enlarging the chip size, the pad size will have to be reduced. As a consequence, the joining areas of individual pads and of the bonding wires connected to them will be reduced, and this means a problem of weakened connection strength between the pads and the bonding wires.

An object of the present invention is to provide a semiconductor device permitting a further increase in pins which multi-functionalization and faster operation would entail.

Another object of the invention is to prevent the reliability of connection between bonding wires and pads from deteriorating even where chips are further reduced in size and provided with an even greater number of pins.

The above-described and other objects and novel features of the present invention will become apparent from the following description in this specification when taken in conjunction with the accompanying drawings.

Typical aspects of the invention disclosed in the present application will be briefly described below.

A semiconductor device according to the invention comprises:

a wiring board having a first main surface and a first back surface, wherein the first main surface is provided with a chip mounting area in its central part, a plurality of ring-shaped first bonding electrodes are formed in a first area surrounding the chip mounting area, a plurality of second bonding electrodes are formed in a second area surrounding the first area, and wiring for electrically connecting the first bonding electrodes with the second bonding electrodes is formed inside;

a semiconductor chip having a second main surface and a second back surface, wherein the second back surface is so mounted over the wiring board as to be in contact with the chip mounting area and a plurality of electrodes are arranged over the second main surface; and a plurality of wires for electrically connecting the plurality of electrodes to respectively matching ones of the first bonding electrodes or the second bonding electrodes, wherein the plurality of first bonding electrodes are electrically connected to a power supply potential or a reference potential, wherein the plurality of second bonding electrodes are used for inputting or outputting signals, wherein the plurality of electrodes are arrayed in a plurality of rows along an outer circumference of the second main surface, and the electrodes included in a first row and the electrodes included in a second row positioned inside the first row within the second main surface are arranged in a zigzag pattern in a direction along the outer circumference of the second main surface, wherein the plurality of electrodes include a plurality of first electrodes electrically connected to the first bonding electrodes and a plurality of second electrodes electrically connected to the plurality of second bonding electrodes, and wherein (a) of the plurality of wires, a plurality of first wires electrically connecting the first bonding electrodes with the plurality of first electrodes have a diameter not smaller than a plurality of second wires electrically connecting the plurality of second bonding electrodes and the plurality of second electrodes, or (b) a plurality of the wires are connected between one of the first electrodes and the first bonding electrodes.

A manufacturing method of a semiconductor device according to the invention comprises the steps of:

(a) fabricating a wiring board having a first main surface and a first back surface, wherein the first main surface is provided with a chip mounting area in its central part, a plurality of ring-shaped first bonding electrodes electrically connected to a power supply potential or a reference potential are formed in a first area surrounding the chip mounting area, a plurality of second bonding electrodes used for inputting or outputting signals are formed in a second area surrounding the first area, and wiring for electrically connecting the first bonding electrodes with the second bonding electrodes is formed inside;

(b) fabricating a semiconductor chip having a second main surface and a second back surface, wherein a plurality of electrodes are arranged in a plurality of rows along an outer circumference of the second main surface;

(c) mounting the semiconductor chip over the wiring board so that the second back surface is in contact with the chip mounting area;

(d) electrically connecting the plurality of electrodes to respectively matching ones of the first bonding electrodes with first wires; and (e) electrically connecting the plurality of electrodes to respectively matching ones of the second bonding electrodes with second wires;

wherein the step (b) includes a step of:

(b1) arranging, in a zigzag pattern in a direction along the outer circumference of the second main surface, the electrodes included in a first row and the electrodes included in a second row positioned inside the first row within the second main surface, wherein the plurality of electrodes include a plurality of first electrodes electrically connected to the first bonding electrodes and a plurality of second electrodes electrically connected to the plurality of second bonding electrodes, and the first wires have a diameter not smaller than that of the second wires.

A manufacturing method of a semiconductor device according to the invention may also comprise the steps of:

(a) fabricating a wiring board having a first main surface and a first back surface, wherein the first main surface is provided with a chip mounting area in its central part, a plurality of ring-shaped first bonding electrodes electrically connected to a power supply potential or a reference potential are formed in a first area surrounding the chip mounting area, a plurality of second bonding electrodes used for inputting or outputting signals are formed in a second area surrounding the first area, and wiring for electrically connecting the first bonding electrodes with the second bonding electrodes is formed inside;

(b) fabricating a semiconductor chip having a second main surface and a second back surface, wherein a plurality of electrodes are arranged in a plurality of rows along an outer circumference of the second main surface;

(c) mounting the semiconductor chip over the wiring board so that the second back surface is in contact with the chip mounting area; and (d) electrically connecting the plurality of electrodes to respectively matching ones of the first bonding electrodes or matching ones of the second bonding electrodes with a plurality of wires;

wherein the step (b) includes a step of:

(b1) arranging, in a zigzag pattern in a direction along the outer circumference of the second main surface, the electrodes included in a first row and the electrodes included in a second row positioned inside the first row within the second main surface, wherein the plurality of electrodes include a plurality of first electrodes electrically connected to the first bonding electrodes and a plurality of second electrodes electrically connected to the plurality of second bonding electrodes, and wherein the plurality of wires are connected between one of the first electrodes and the first bonding electrodes.

Advantages achieved by some of the most typical aspects of the invention disclosed in the present application will be briefly described below.

Thus the invention can provide a semiconductor device permitting a further increase in pins which multi-functionalization and faster operation would entail.

DESCRIPTION OF THE PREFERRED EMBODIMENTS OF THE INVENTION

Preferred embodiments of the present invention will be described in detail below with reference to drawings. In all the drawings illustrating the embodiments, members having the same function will be denoted by respectively the same reference signs as a rule, and their description will not be repeated.

(Embodiment 1)

Figure 1:
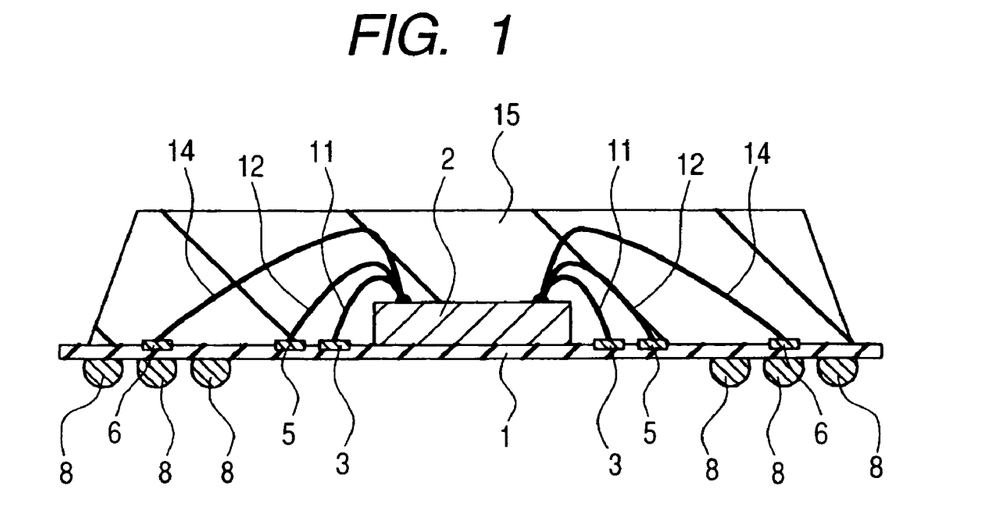
FIG. 1 shows a sectional view of the structure of a semiconductor device, which is Embodiment 1 of the present invention.
Figure 2:
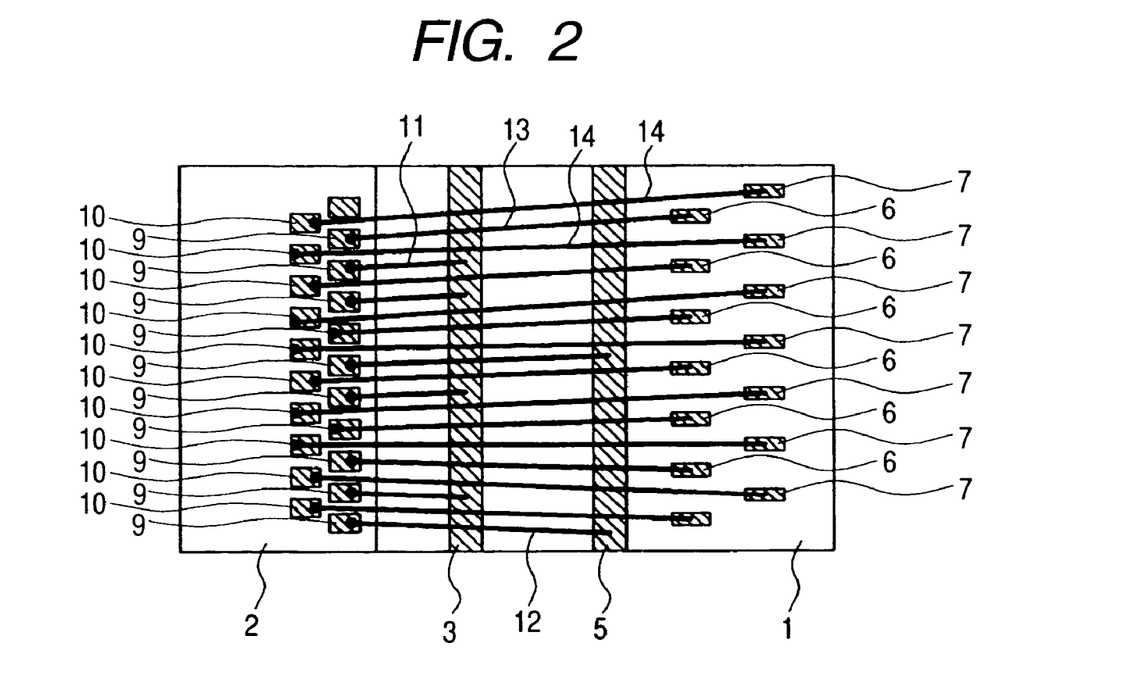
FIG. 2 shows a plan of the essential part of the semiconductor device shown in FIG. 1.
Figure 3:
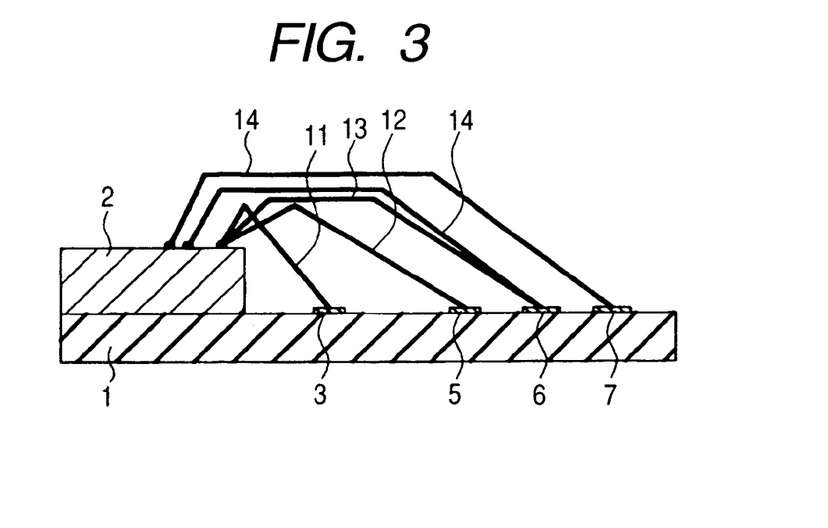
FIG. 3 shows a section of the essential part of the semiconductor device shown in FIG. 1.

FIG. 1 is a section showing an example of structure of a semiconductor device, which is Embodiment 1; FIG. 2 is a plan of the essential part of the semiconductor device shown in FIG. 1; and FIG. 3 is a section of the essential part of the semiconductor device shown in FIG. 1.

The semiconductor device of this Embodiment 1 is a resin-sealed type semiconductor package in which a chip 2 is mounted over a wiring board 1, and a logic IC or an application specific IC (ASIC) containing a logic IC is formed over the chip 2. In the following description of this Embodiment 1, a ball grid array (BGA) shown in FIG. 1 will be taken up as an example of that semiconductor package.

The wiring board 1 has a main surface (first main surface) and a back surface (first back surface), and in the chip mounting area of its central part the chip 2 is mounted. In the outer circumferential area (first area) of that chip mounting area, ring-shaped bonding electrodes 3 and 5 surrounding the chip area are disposed. In an area (second area) farther out than the area in which the bonding electrodes 3 and 5 are disposed, bonding electrodes (second bonding electrodes) 6 and 7 (the bonding electrode 7 is not shown in FIG. 1) are arranged, respectively surrounding the bonding electrodes 3 and 5. The wiring board 1 is formed of a glass fiber-reinforced epoxy substrate for instance. It is a built-up wiring board formed by alternately stacking insulating layers and wirings. A plurality of solder balls 8, which are external terminals, are fitted to the back surface of the wiring board 1. These solder balls 8 are electrically connected to bonding electrodes 3 through 7, other than the bonding electrode 6, via wirings (wiring layers) formed within the wiring board 1. The bonding electrode 3 is electrically connected to a ground potential (reference potential) via a wiring formed within the wiring board 1 and prescribed solder balls 8. The bonding electrode 5 is supplied with a potential from an external source via a wiring formed within the wiring board 1 and prescribed solder balls 8.

The chip 2 is so mounted that its back surface (second back surface) is in contact with the chip mounting area of the main surface of the wiring board 1. Over the main surface (first back surface) of the chip 2, bonding pads (electrodes, first electrodes) 9 are arranged in an array along the outer circumference to constitute a first row. In the area inside the area in which the bonding pads 9 are arranged, similarly to the bonding pads 9, bonding pads (electrodes, second electrodes) 10 are arranged in an array along the outer circumference along the main surface of the chip 2 to constitute a second row. The bonding pads 9 include one that is electrically connected to the aforementioned ground potential or external power supply potential. The bonding pad 9 that is electrically connected to the ground potential is electrically connected to a bonding electrode 3 via a wire (first wire) 11. The bonding pad 9 that is electrically connected to the external power supply potential is electrically connected to a bonding electrode 5 via a wire (first wire) 12. The bonding pads 9 are electrically connected to the bonding electrodes 6 via wires (second wires) 13. The bonding pad 9 connected to the wire 13 inputs and outputs signals including data signals and command signals via the wires 13. The bonding pads 10, used for inputting and outputting signals into and out of the chip 2, are electrically connected to the bonding electrodes 6 and 7 via wires (second wires) 14. These wires 11 through 14 are formed of gold (Au) for instance.

The main surface of the wiring board 1, the chip 2 and the wires 11 through 14 are resin-sealed with a seal 15.

Figure 4:
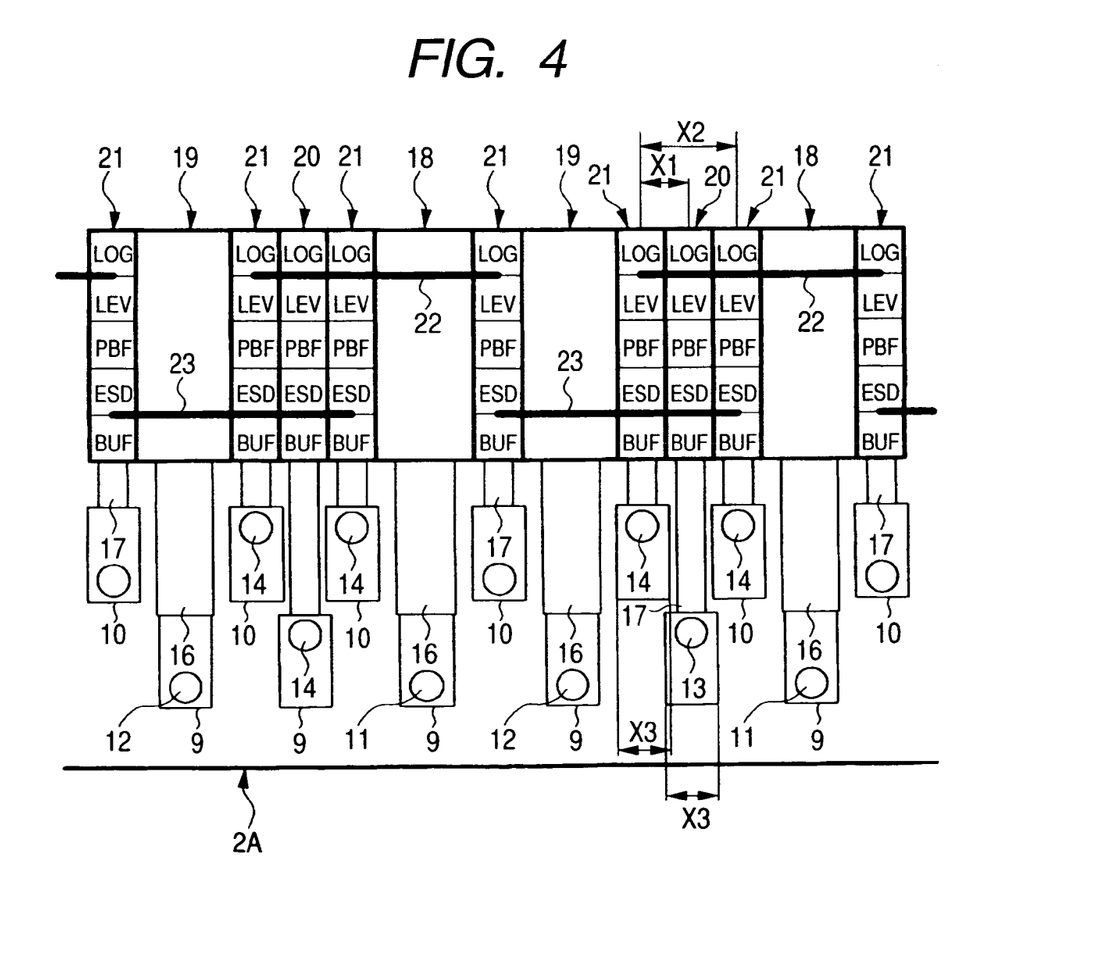
FIG. 4 illustrates circuit cells to which bonding pads arranged over the main surface of the chip are electrically connected and the relationships of electrical connection among the individual circuit cells.
Figure 5:
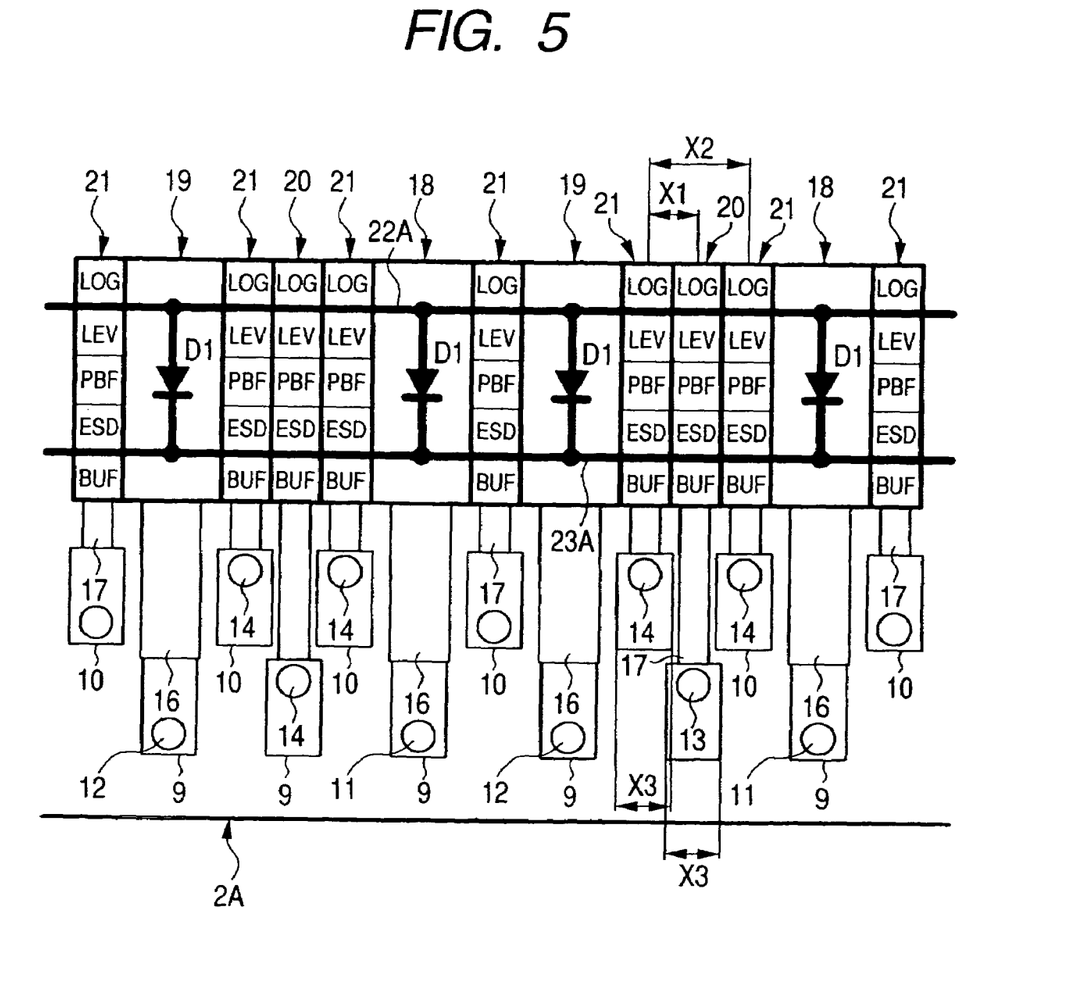
FIG. 5 illustrates circuit cells to which bonding pads arranged over the main surface of the chip are electrically connected and the relationships of electrical connection among the individual circuit cells.

FIG. 4 and FIG. 5 illustrate circuit cells to which the bonding pads 9 and 10 are electrically connected and the relationships of electrical connection among the individual circuit cells in the essential part of the chip 2. Further in FIG. 4 and FIG. 5, the wires 11 through 14 each connected to one or another of the bonding pads 9 and 10 are shown only in their connecting parts to the bonding pads 9 and 10.

As stated above, the bonding pads 9 and 10 are arranged in different rows along the outer circumference of the main surface of the chip 2 (chip end 2A). These bonding pads 9 and 10 are electrically connected to respectively prescribed circuit cells via wirings 16 and 17 formed by patterning aluminum (Al) films for instance.

Those of the bonding pads 9 which are electrically connected to the bonding electrode 3 via the wires 11 are electrically connected to power supply circuit cells 18 and, together with the wirings 16, electrically connect the power supply circuit cells 18 to a reference potential (ground potential). Those of the bonding pads 9 which are electrically connected to the bonding electrode 5 via the wires 12 are electrically connected to power supply circuit cells 19, and supply an external power supply potential from an external power source to the power supply circuit cells 19 via the wirings 16. Those of the bonding pads 9 which are electrically connected to the bonding electrode 6 via the wires 13 are electrically connected to input/output circuit cells 20, and transmit clock signals sent from the input/output circuit cells 20 to the bonding electrode 6 via the wires 13 or transmit signals sent from the bonding electrode 6 via the wires 13 to the input/output circuit cells 20 via the wirings 17. The bonding pads 10 electrically connected to the bonding electrodes 6 and 7 via the wires 14 are electrically connected to input/output circuit cells 21, and transmit and receive various signals to and from the bonding electrodes 6 and 7 via the wires 14.

Each of the input/output circuit cells 20 and 21 is formed of, for instance, the buffer circuit BUF, an anti-electrostatic destruction circuit ESD, a pre-buffer circuit PBF, a level shift circuit LEV or a logic circuit LOG.

In the example of relationships of electrical connection among the individual circuit cells shown in FIG. 4, one power supply circuit cell 18 is electrically connected to four input/output circuit cells 20 and 21 via a wiring 22, and electrically connects prescribed circuits in the four input/output circuit cells 20 and 21 to the reference potential (ground potential) via that wiring 22. Another power supply circuit cell 19 is electrically connected to four input/output circuit cells 20 and 21 via a wiring 23 and supplies an external power supply potential from an external power source to prescribed circuits in the four input/output circuit cells 20 and 21 via that wiring 23. On the other hand in the example of relationships of electrical connection among the individual circuit cells shown in FIG. 5, there are provided a ring-shaped wiring 22A electrically connected to all the power supply circuit cells 18 and a ring-shaped wiring 23A electrically connected to all the power supply circuit cells 19. Further in the power supply circuit cells 18 and 19, electrostatic destruction is prevented by arranging, between the wiring 22A connected to the reference potential and the wiring 23A connected to the power supply potential, a diode D1 of which the anode is connected to the wiring 22A and the cathode is connected to the wiring 23A. The means of preventing electrostatic destruction applicable here is not limited to the diode D1, but one or another of various anti-electrostatic destruction circuits available according to the known art can be arranged between the wiring 22A and the wiring 23A. The wiring 22A is electrically connected to all the input/output circuit cells 20 and 21, and electrically connects prescribed circuits in the input/output circuit cells 20 and 21 to the reference potential (ground potential) The wiring 23A is also electrically connected to all the input/output circuit cells 20 and 21, and supplies an external power supply potential from an external power source to prescribed circuits in the input/output circuit cells 20 and 21. The presence of these wirings 22A and 23A can give the same effect as that of the wirings 22 and 23 shown in FIG. 4. The following description of this Embodiment 1 will refer to a case in which the wirings 22 and 23 are provided.

In this Embodiment 1, the bonding pads 9 and the bonding pads 10 are arranged in a zigzag pattern in a direction along the outer circumference of the main surface of the chip 2. This arrangement of the bonding pads 9 and 10 enables bonding pads 9 and 10 of greater square measure to be arranged than in another arrangement where, for instance, all the bonding pads 9 and 10 are arranged in a single row instead of arranging 9 in a row and the bonding pads 10 in another separate row (hereinafter referred to as Comparative Example 1). Suppose, for instance, that the arrangement pitch X1 (about 40 μm) between directly adjoining input/output circuit cells 20 and 21 and the arrangement pitch X2 (about 80 μm) between indirectly adjoining input/output circuit cells 21 with one input/output circuit cell 20 between them are the same in this Embodiment 1 and in Comparative Example 1. The width X3 of the bonding pads 9 and 10, which is about 35 μm in Comparative Example 1, can be expanded to about 50 μm in this Embodiment 1. As this enables a large area in which the bonding pads 9 and 10 can be connected to the wires 11 through 14 to be secured, the diameters of the wires 11 through 14 can be enlarged. As a result, it is made possible to increase the connection strength between the bonding pads 9 and 10 and the wires 11 through 14. The enlarged areas of the bonding pads 9 and 10 make the positions in which these bonding pads 9 and 10 are arranged more readily recognizable. This in turn makes it possible to fit the wires 11 through 14 even if a wire bonder whose capability to recognize the positions of bonding pads is poor.

Further, in this Embodiment 1, to focus on those of the bonding pads 9 electrically connected to the ground potential (those to which the wires 11 are connected) and those of the bonding pads 9 to which an external power supply potential is supplied from the external power source (those to which the wires 12 are connected), an odd number of bonding pads (the bonding pads 9 and bonding pads 10 electrically connected to the input/output circuit cells 20) are arranged between adjoining bonding pads 9 in a direction along the outer circumference of the main surface of the chip 2. The arrangement and electrical connection of the bonding pads 9 and 10 in this way makes it possible to use as the bonding pads electrically connected to the ground potential and the bonding pads to which an external power supply potential is supplied from the external power source (hereinafter these bonding pads 9 will be referred to as power supply-line bonding pads) the bonding pads 9 arranged farther out on the outer circumference than the bonding pads 10 within the main surface of the chip 2. By arranging in this way the power supply-line bonding pads 9 farther out on the outer circumference than the bonding pads 10 and arranging the bonding electrodes 3 and 5, to which these power supply-line bonding pads 9 are electrically connected, within the main surface of the wiring board 1 farther inside in relative terms, the lengths of the wires 11 and 12 which electrically connect the power supply-line bonding pads 9 to the bonding electrodes 3 and 5 can be shortened. As this enables the electrical resistances of the wires 11 and 12 to be reduced, it is made possible to raise the operating speed of the logic IC formed within the chip 2 for instance.

Incidentally, the way in which the bonding pads 9 and 10 are arranged in this Embodiment 1 makes the wirings 16 arranged between the power supply circuit cells 18 and 19 and the bonding pads 9 longer than in Comparative Example 1. Further, between the wirings 16 connected to the power supply-line bonding pads 9, at least one wiring 17 connected to other bonding pads (hereinafter referred to as signal-line bonding pads) is arranged. This layout inevitably invites an increase in the distance between the wiring 16 connected to the power supply potential and the wiring 16 connected to the reference potential. With the increase in the distance between the power supply-line wirings 16 themselves, the distance between the power supply wiring and the wiring in the vicinity to supply the ground potential, which constitutes the main return current route for the power supply current elongates. Therefore, the current loop becomes greater, and the self-inductance of the power supply-line wiring and the mutual inductance tend to become greater.

Figure 6:
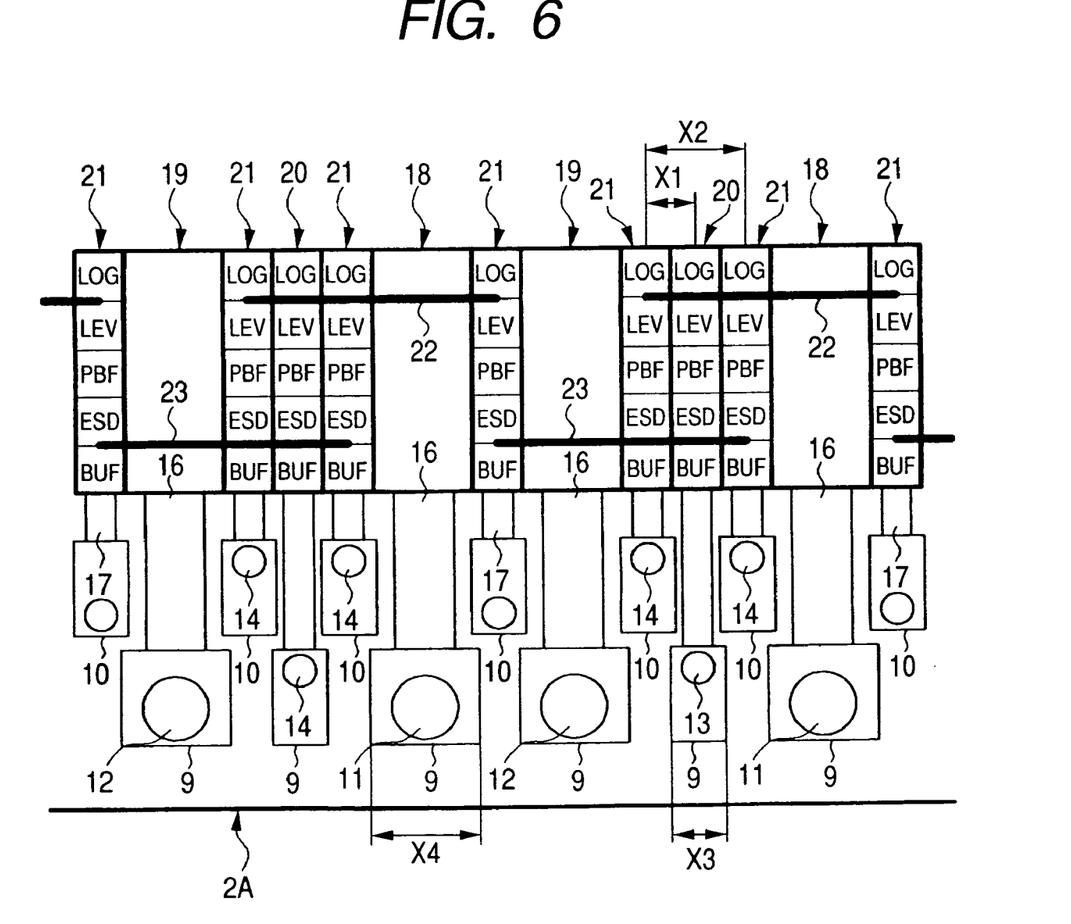
FIG. 6 illustrates circuit cells to which bonding pads arranged over the main surface of the chip are electrically connected, the relationships of electrical connection among the individual circuit cells the main surface of the chip, and wires connected to the bonding pads.
Figure 7:
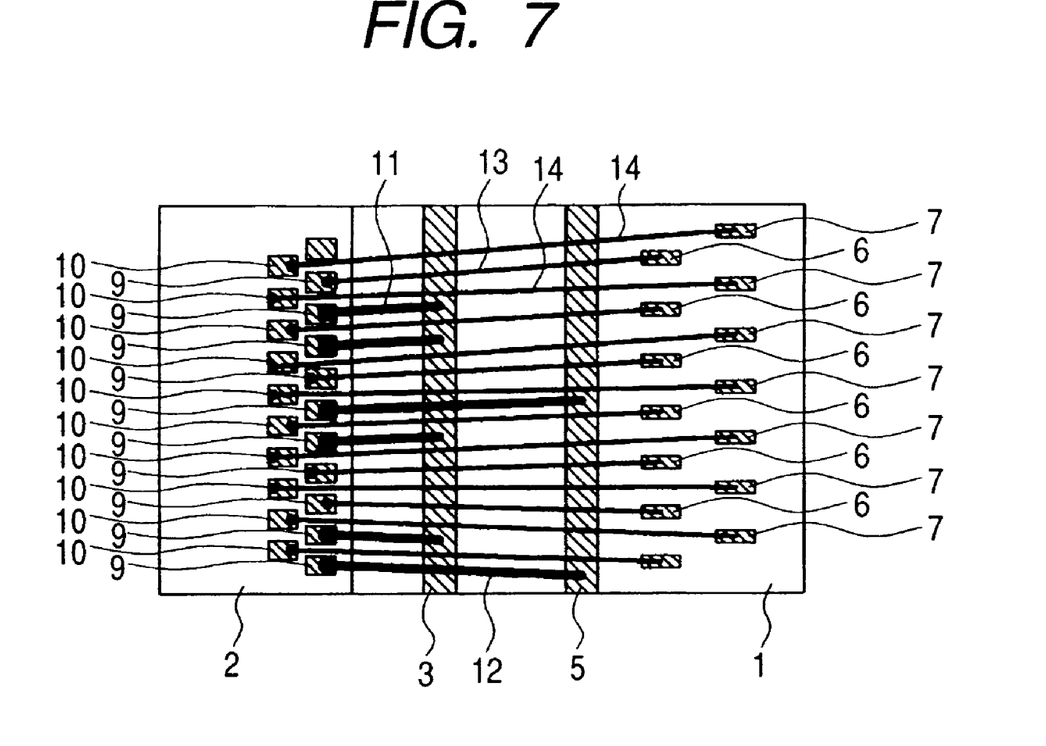
FIG. 7 shows a plan of the essential part of the semiconductor device, which is Embodiment 1 of the invention.
Figure 8:
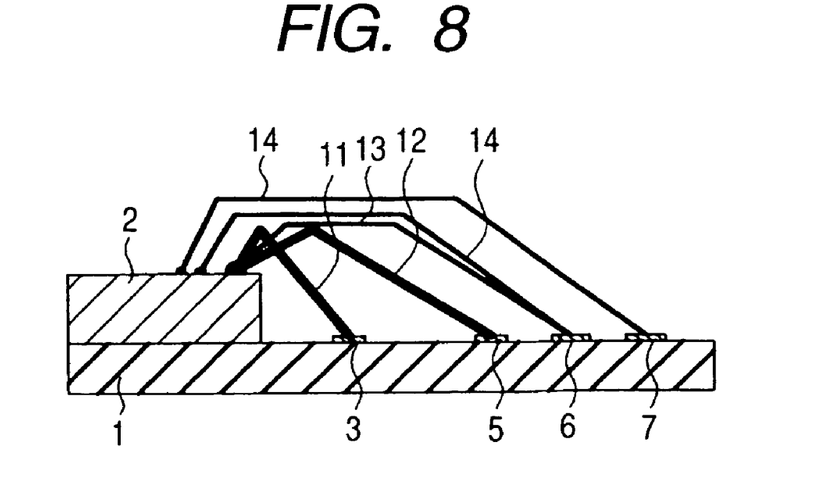
FIG. 8 shows a section of the essential part of the semiconductor device, which is Embodiment 1 of the invention.

As stated above, the bonding pads 9 and the bonding pads 10 are arranged in a zigzag pattern in a direction along the outer circumference of the main surface of the chip 2 in this Embodiment 1 and therefore no wiring is arranged between adjoining bonding pads 9, a greater width X4, about 100 μm for instance, can be secured for the power supply-line bonding pads 9 than the width X3 of the bonding pads 10 as shown in FIG. 6. As a result, the diameter of the wires 11 and 12 connected to the power supply-line bonding pads 9 can be greater than that of other wires 13 and 14 in this Embodiment 1 as shown in FIG. 6 through FIG. 8. In this Embodiment 1, while the diameter of the wires 13 and 14 is 20 μm, that of the wires 11 and 12 can be 30 μm, for example. As a result, the impedance in the wires 11 and 12 can be reduced, and therefore the impedance increased by the wirings 17 can be cancelled by the lowered resistances of the wires 11 and 12. Thus, as the overall impedance of the wirings 17 connected to the power supply circuit cells 18 and 19, the bonding pads 9 and the wires 11 and 12 can be reduced, it is made possible raise the operating speed of the logic IC formed within the chip 2 or to make the ASIC multi-functional.

Hereupon, the process of connecting the wires 11 and 12 whose diameter is greater than that of the wires 13 and 14 will be described. First, after mounting the chip 2 in the chip mounting area of the main surface of the wiring board 1, the wires 11 and 12 are connected between the power supply-line bonding pads 9 and the bonding electrodes 3 and 5, respectively, by using a first wire bonder (first bonding device). The locus of that first wire bonder will be substantially triangular. While the wires 11 and 12 are substantially triangular in FIG. 8, this triangle is supposed to be the locus of the motion of the first wire bonder. By so operating the first wire bonder as to leave such a locus, it is made possible to fit the wires 11 and 12, whose relative lengths are short, between the power supply-line bonding pads 9 and the bonding electrodes 3 and 5, respectively, in a short period of time. Then, the first wire bonder is replaced with a second wire bonder (second bonding device), and the wires 13 are connected between the bonding pads 9 electrically connected to the input/output circuit cells 20 formed within the chip 2 and the bonding electrode 6. The reason for this change in the type of the wire bonder used is a difference in the thickness of wires that can be fitted with a given wire bonder. Then, by using that second wire bonder, the wires 14, which make the loop after connection higher than the wires 11 through 13, are connected between the bonding pads 10 and the bonding electrodes 6 and 7. The locus of that second wire bonder will be substantially trapezoidal. While the wires 14 are substantially trapezoidal in FIG. 8, this trapezoid is supposed be the locus of the motion of the second wire bonder. By connecting in this way the wires 14 which make the loop after connection higher after the wire 11 through 13 which make the loop after connection lower, the trouble of the wires 14 coming into contact with the wires 11 through 13 can be prevented.

Figure 9:
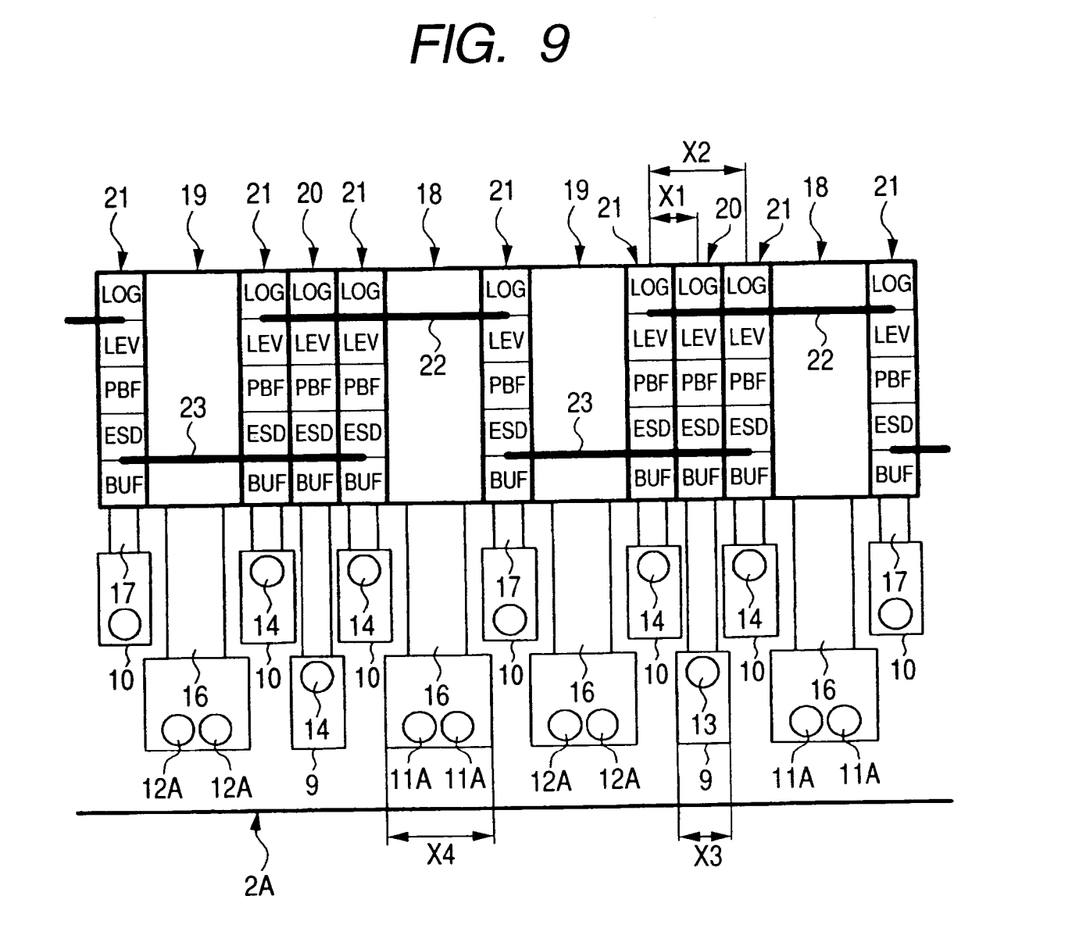
FIG. 9 illustrates circuit cells to which bonding pads arranged over the main surface of the chip are electrically connected, the relationships of electrical connection among the individual circuit cells the main surface of the chip, and wires connected to the bonding pads.

Alternatively, instead of using the wires 11 and 12 whose diameter is relatively larger as stated above, a plurality of, for instance two, wires (first wires) 11A and 12A about equal in diameter to the wires 13 through 14 may be connected between the power supply-line bonding pads 9 and the bonding electrodes 3 and 5, respectively, as shown in FIG. 9. The use of such wires 11A and 12A enables the second wire bonder for use in the connection of the wires 13 and 14 to be used at the step of connecting the wires 11A and 12A as well. Thus, it is made possible to perform the step of connecting the wires 11A, 12A, 13 and 14 with only one wire bonder (second wire bonder).

(Embodiment 2)

The semiconductor device of this Embodiment 2, like the above-described semiconductor device of Embodiment 1, is a resin-sealed semiconductor package configured by mounting a chip over a wiring board.

Figure 10:
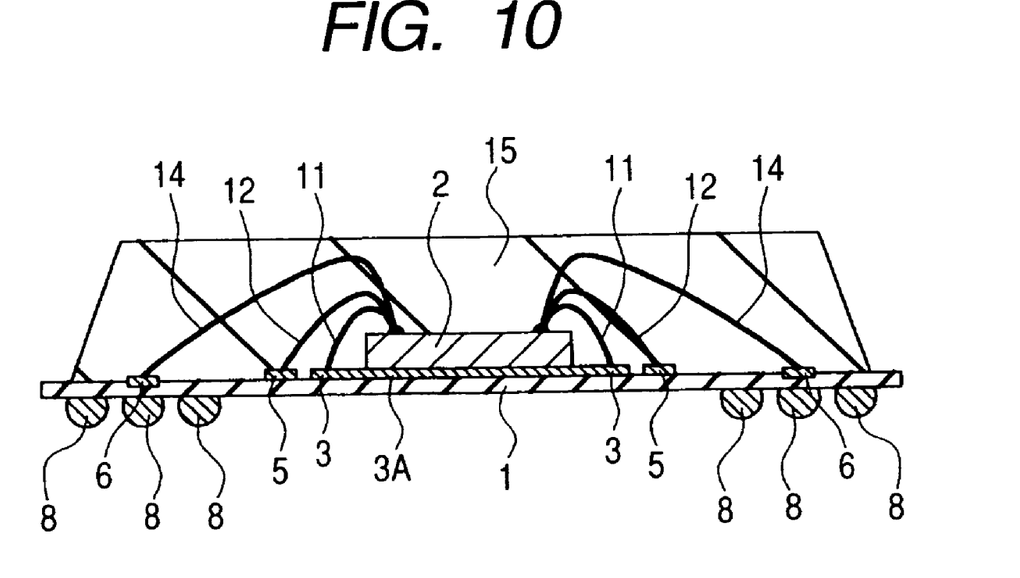
FIG. 10 shows a sectional view of the structure of a semiconductor device, which is Embodiment 2 of the invention.
Figure 11:
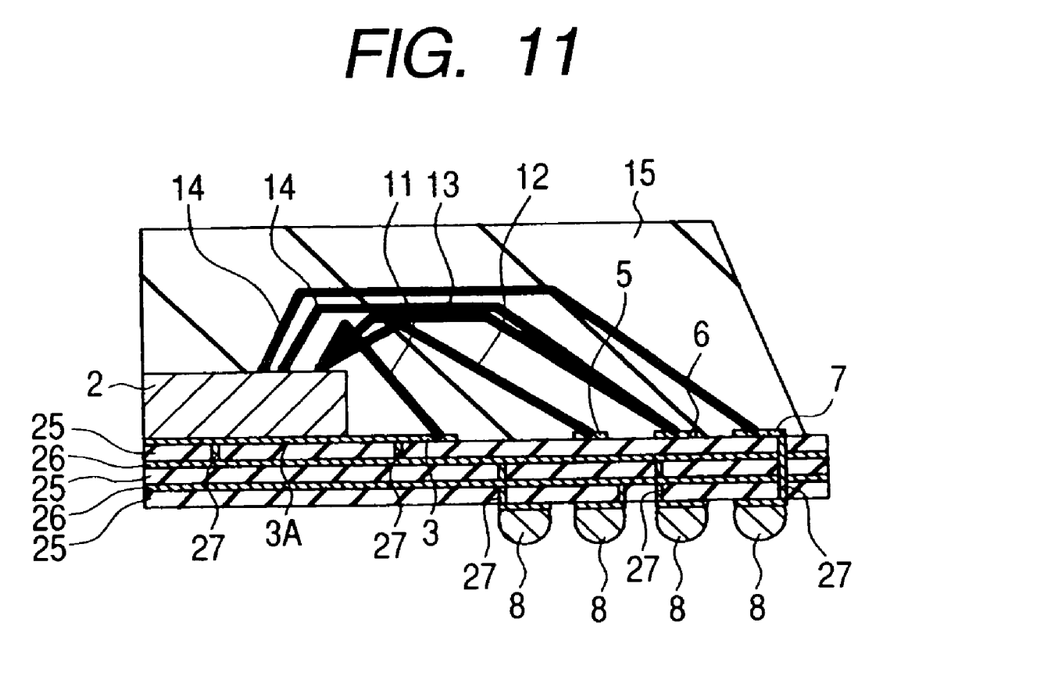
FIG. 11 shows a section of the essential part of the semiconductor device shown in FIG. 10.

FIG. 10 shows a sectional view of an example of structure of the semiconductor device of this Embodiment 2; FIG. 11 shows a plan of the essential part of the semiconductor device shown in FIG. 10; and FIG. 12 shows a section of the essential structure of a chip contained in the semiconductor device shown in FIG. 10 and the relationships of electrical connection among electrodes and various members arranged underneath the chip.

In this Embodiment 2, an electrode (third bonding electrode) 3A is arranged in the chip mounting area of the main surface in the wiring board 1 contained in the semiconductor device of Embodiment 1 described above. This electrode 3A is continuous from the bonding electrode 3 surrounding it, the electrode 3A and the bonding electrode 3 being integrally formed of the same material. The chip 2 is so mounted over the wiring board 1 that its back surface be in contact with the electrode 3A.

As already described with reference to Embodiment 1, the wiring board 1 is a built-up wiring board formed by alternately stacking insulating layers 25 and wirings (wiring layers) 26 (see FIG. 11). Respectively matching ones of the electrode 3A, the bonding electrodes 3 through 5, the wiring layers 25 and the solder balls 8 are electrically connected by wirings 27 arranged in through holes bored in the wiring board 1.

Figure 12:
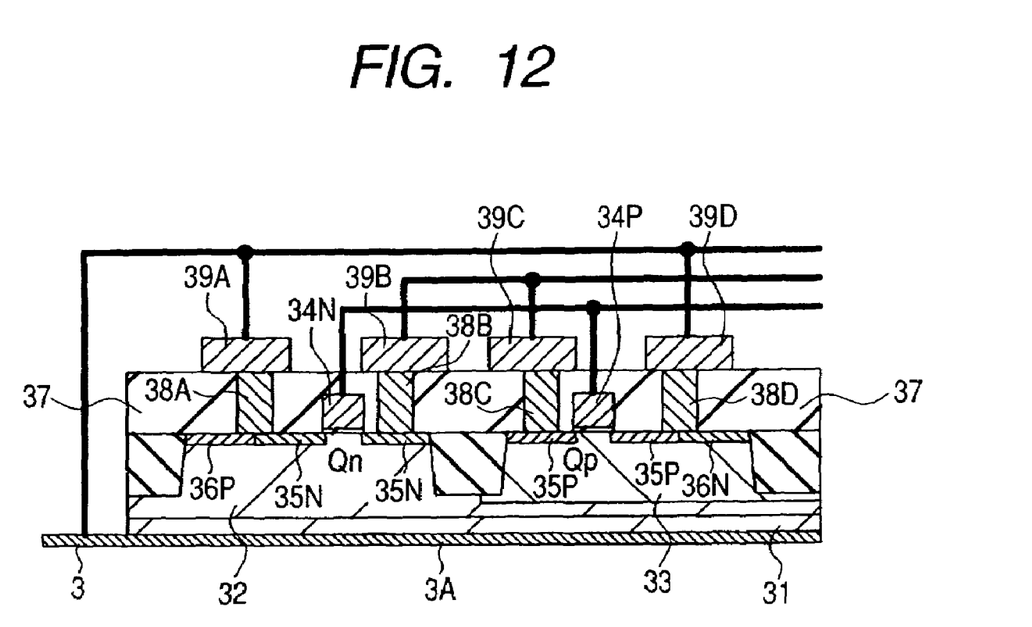
FIG. 12 shows a section of the essential structure of a chip contained in a semiconductor device, which is Embodiment 2 of the invention, and the relationships of electrical connection among electrodes and various members arranged underneath the chip.

Further, as shown in FIG. 12, the chip 2 has a p-channel type metal insulator semiconductor field effect transistor (MISFET) Qp and an n-channel type MISFET Qn consisting of silicon (Si), for instance, both formed over the main surface of a p-type semiconductor substrate 31. Over the main surface of the semiconductor substrate 31, there are formed a p-type well 32 and an n-type well 33, and gate electrodes 34P and 34N are formed over the p-type well 32 and the n-type well 33, respectively. Over the n-type well 33 on both sides of the gate electrode 34P a p-type semiconductor area 35P is formed, and the p-channel type MISFET Qp uses this p-type semiconductor area 35P as its source and drain. Over the p-type well 32 on both sides of the gate electrode 34N an n-type semiconductor area 35N is formed, and the n-channel type MISFET Qn uses this semiconductor area 35N as its source and drain. In the position adjoining the p-type semiconductor area 35P constituting the source of the p-channel type MISFET Qp, there is formed an n-type semiconductor area 36N, and in the position adjoining the semiconductor area 35N constituting the source of the n-channel type MISFET Qn there is formed a p-type semiconductor area 36P. Further, over the main surface of the semiconductor substrate 31 where the n-channel type MISFET Qn and the p-channel type MISFET Qp are formed, there is formed an inter-layer insulating film 37, and within a contact hole bored in the inter-layer insulating film 37 there are formed plugs 38A, 38B, 38C and 38D. Over the plugs 38A, 38B, 38C and 38D, there are formed wirings 39A, 39B, 39C and 39D to be connected to them. The plug 38A reaches the n-type semiconductor area 35N, which is the source of the n-channel type MISFET Qn, and the p-type semiconductor area 36P, and is electrically connected to these areas and the wiring 39A. The plug 38B reaches the n-type semiconductor area 35N, which is the drain of the n-channel type MISFET Qn, and is electrically connected to this area and the wiring 39B. The plug 38C reaches the p-type semiconductor area 35P, which is the drain of the p-channel type MISFET Qp, and is electrically connected to this area and the wiring 39C. The plug 38D reaches the p-type semiconductor area 35P, which is the source of the p-channel type MISFET Qp, and the n-type semiconductor area 36N, and is electrically connected to these areas and the wiring 39D. The wirings 39A and 39D are further electrically connected to the bonding electrode 3 via wiring (not shown) formed in a layer above. The back surface of the semiconductor substrate 31 is in contact with the electrode 3.

Incidentally, in order to achieve faster operation while maintaining the electrical characteristics of the logic IC formed within the chip 2, it is required to enhance the current capacities between the logic IC and the external power source and between the logic IC and the ground potential (reference potential), and conceivable means of achieving this include increasing the number of the power supply-line bonding pads 9 and those of the wires 11 and 12 connected to them. Where such a means is used, if it is also required to reduce the size of the chip 2, for instance, the power supply-line bonding pads 9 will be reduced in size, and the wires 11 and 12 will be thinned. As a result, the electrical resistances of the wires 11 and 12 will increase, making it difficult to achieve enhancement of current capacities and size reduction of the chip 2 at the same time.

On the other hand, in the semiconductor device of this Embodiment 2, as the electrode 3 is formed integrally with the bonding electrode 3, which is electrically connected to the ground potential (reference potential), the chip 2 can be electrically connected with its whole back surface to the ground potential (reference potential). This enables the current capacity between the logic IC and the ground potential (reference potential) within the chip 2 to be enhanced. Thus it is made possible to achieve faster operation while maintaining the electrical characteristics of the logic IC. The enhancement of the current capacity between the logic IC and the ground potential (reference potential) makes it possible to reduce noise arising in the logic IC. Further, the electrical connection of the chip 2 to the ground potential (reference potential) through its whole back surface enables a sufficiently large current capacity to be secured between the logic IC and the ground potential (reference potential), it is made possible to reduce the bonding pads 9 and the wires 11 electrically connected to the ground potential (reference potential). This contributes to reducing the size of the chip 2. Where the bonding pads 9 and the wires 11 electrically connected to the ground potential (reference potential) are dispensed with, the bonding pads 9 and the wires 12 electrically connected to the external power supply potential may as well be arranged to enhance the current capacity between the logic IC and the external power source.

This Embodiment 2 so far described can give the same effect as the foregoing Embodiment 1.

(Embodiment 3)

Figure 13:
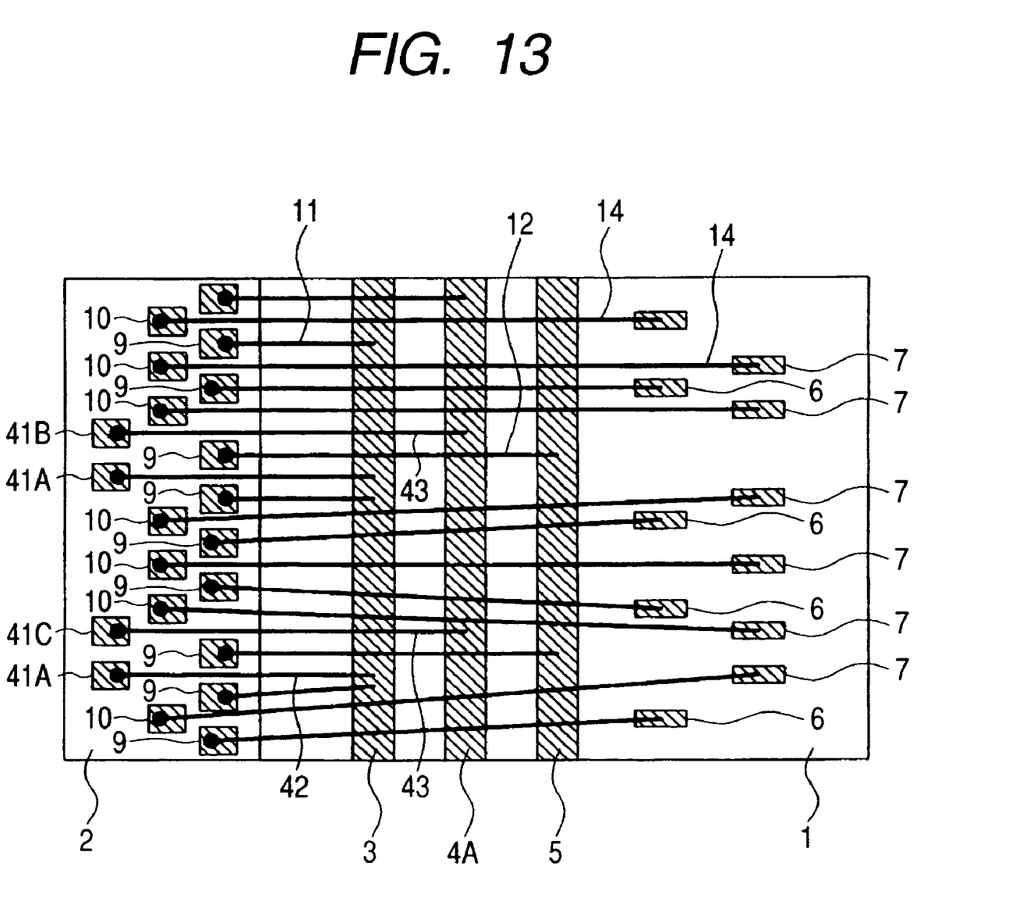
FIG. 13 shows a plan of the essential part of a semiconductor device, which is Embodiment 3 of the invention.

FIG. 13 shows a plan of the essential part of a semiconductor device, which is this Embodiment 3.

The semiconductor device of this Embodiment 3 has an internal power supply circuit within the chip 2 (see FIG. 1) contained in the semiconductor device of Embodiment 1. In this Embodiment 3, a bonding electrode 4A is electrically connected only to that internal power supply circuit. That internal power supply circuit converts an external power source voltage (about 5.5 V for instance) supplied from an external power source, for instance, into a prescribed voltage (about 3.3 V for instance), and supplies it as the internal operation voltage to circuits within the chip 2.

Over the main surface of the chip 2, bonding pads 41A, 41B and 41C are arranged to constitute a third row along the outer circumference of the main surface of the chip 2 in an area inside the area in which the bonding pads 10 are arranged. These bonding pads 41A, 41B and 41C are to be electrically connected to the internal power supply circuit. The bonding pads 41A are electrically connected to the bonding electrode 3 via wires 42 to be electrically connected to the ground potential (reference potential). Bonding pads (third electrode, fourth electrode) 41B and 41C are electrically connected to the bonding electrode 4A via wires 43.

Figure 14:
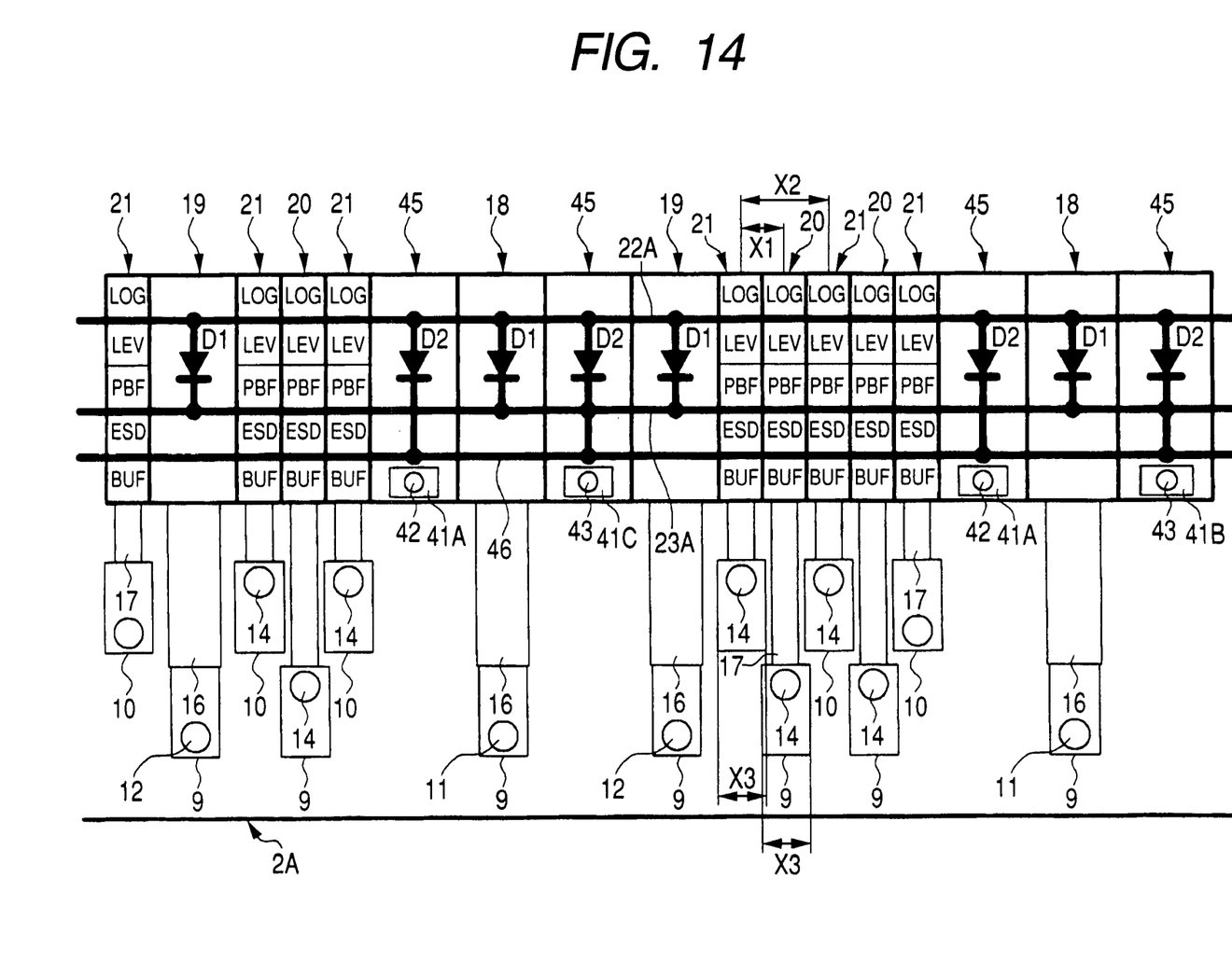
FIG. 14 illustrates circuit cells to which bonding pads arranged over the main surface of the chip are electrically connected, the relationships of electrical connection among the individual circuit cells the main surface of the chip, and wires connected to the bonding pads.

As shown in FIG. 14, the bonding pads 41A, 41B and 41C, like the bonding pads 9 and 10, are electrically connected to prescribed circuit cells via wiring 44 formed by patterning an Al film for instance.

The bonding pads 41A electrically connected to the bonding electrode 3 via the wires 42 are electrically connected to internal power supply circuit cells 45 and, together with the wiring 44, electrically connect the internal power supply circuit cells 45 to the reference potential (ground potential). The bonding pads 41B and 41C electrically connected to the bonding electrode 4A via the wires 43 are electrically connected to the internal power supply circuit cells 45 via the wiring 44, and perform the role of delivering an internal operation voltage fed from the internal power supply circuit cells 45 via the wiring 44 to the bonding electrode 4A via the wires 43 or the role of delivering the internal operation voltage fed via the bonding electrode 4A and the wires 43 to the internal power supply circuit cells 45 via the wiring 44.

In the example of relationships of electrical connection among the circuit cells shown in FIG. 14, the ring-shaped wiring 22A electrically connected to all the power supply circuit cells 18 and the ring-shaped wiring 23A electrically connected to all the power supply circuit cells 19 in the same way as in the above-cited example of Embodiment 1 shown in FIG. 5, and in the power supply circuit cells 18 and 19 electrostatic, destruction is prevented by arranging the diode D1 between the wirings 22A and 23A. Further, ring-shaped wiring 46 electrically connected to all the internal power supply circuit cells 45 is provided, and in the internal power supply circuit cells 45 electrostatic, destruction is prevented by arranging a diode D2 between the wirings 22A and 46. Also, the wiring 46 is electrically connected to all the input/output circuit cells 20 and 21, and supplies an internal power voltage to prescribed circuits in the input/output circuit cells 20 and 21.

In this Embodiment 3, the bonding pads 9, bonding pads 10 and bonding pads 41A, 41B and 41C are arranged in a zigzag pattern in a direction along the outer circumference of the main surface of the chip 2 (see FIG. 14). This arrangement of the bonding pads 9, 10, 41A, 41B and 41C, like the above-described arrangement in Embodiment 1, enables the bonding pads 9, 10, 41A, 41B and 41C of larger areas to be arranged than where, for instance, all the bonding pads 9, 10, 41A, 41B and 41C are arranged in a single row.

Further, the arrangement of the bonding pads 41A, 41B and 41C within the internal power supply circuit cells 45 enables the semiconductor chip to be reduced in size.

Also in this Embodiment 3, as in Embodiment 1 described above, to focus on the power supply-line bonding pads 9 in particular, an odd number of bonding pads (the bonding pads 9, 10, 41A, 41B and 41C electrically connected to the input/output circuit cells 20) are arranged between adjoining bonding pads 9 in a direction along the outer circumference of the main surface of the chip 2. The arrangement and electrical connection of the bonding pads 9, 10, 41A, 41B and 41C in this way make it possible, in this Embodiment 3 as well, to use, as the power supply-line bonding pads 9, the bonding pads 9 arranged farther out on the outer circumference than the bonding pads 10, 41A, 41B and 41C within the main surface of the chip 2. By arranging in this way the power supply-line bonding pads 9 farther out on the outer circumference than the bonding pads 10, 41A, 41B and 41C and arranging the bonding electrodes 3 and 5, to which these power supply-line bonding pads 9 are electrically connected, farther inside in relative terms in the main surface of the wiring board 1, the lengths of the wires 11 and 12 which electrically connect the power supply-line bonding pads 9 to the bonding electrodes 3 and 5 can be shortened. As this enables the electrical resistances of the wires 11 and 12 to be reduced, it is made possible to raise the operating speed of the logic IC formed within the chip 2, for instance.

This Embodiment 3 so far described can give the same effect as the foregoing Embodiment 1.

While the invention accomplished by the present inventors has been described so far in specific terms with reference to preferred embodiments thereof, obviously the invention is not confined to these embodiments, but can be modified in various ways without deviating from its true spirit and scope.

The semiconductor device and its manufacturing method according to the invention can be extensively applied to semiconductor devices which can meet the requirement for a further increase in pins, which multi-functionalization and faster operation would entail, and to its manufacturing process.

What is claimed is:

1. A semiconductor device comprising:
a wiring board having a first main surface and a first back surface, wherein said first main surface is provided with a chip mounting area in its central part, a plurality of ring-shaped first bonding electrodes are formed in a first area surrounding said chip mounting area, a plurality of second bonding electrodes are formed in a second area surrounding said first area, and wiring for electrically connecting said first bonding electrodes with said second bonding electrodes is formed inside;
a semiconductor chip having a second main surface and a second back surface, wherein said second back surface is so mounted over said wiring board as to be in contact with said chip mounting area and a plurality of electrodes are arranged over said second main surface; and a plurality of wires for electrically connecting said plurality of electrodes to respectively matching ones of said first bonding electrodes or said second bonding electrodes, wherein said plurality of first bonding electrodes are electrically connected to a power supply potential or a reference potential, wherein said plurality of second bonding electrodes are used for inputting or outputting signals, wherein said plurality of electrodes are arrayed in a plurality of rows along an outer circumference of said second main surface, and said electrodes included in a first row and said electrodes included in a second row positioned inside said first row within said second main surface are arranged in a zigzag pattern in a direction along said outer circumference of said second main surface, wherein said plurality of electrodes include a plurality of first electrodes electrically connected to said first bonding electrodes and a plurality of second electrodes electrically connected to said plurality of second bonding electrodes, and wherein, of said plurality of wires, a plurality of first wires electrically connecting said first bonding electrodes with said plurality of first electrodes have a diameter not smaller than a plurality of second wires electrically connecting said plurality of second bonding electrodes and said plurality of second electrodes.

2. The semiconductor device according to claim 1,
wherein said plurality of first electrodes are included in said first row,
wherein an odd number of said second electrodes are arranged between adjoining ones of said first electrodes in the direction along said outer circumference of said second main surface.

3. The semiconductor device according to claim 1,
wherein a third bonding electrode electrically connected to the reference potential is formed in said chip mounting area of said first main surface of said wiring board, and
wherein, of said plurality of first bonding electrodes, those arranged innermost are formed integrally with said third bonding electrode.

4. The semiconductor device according to claim 1,
wherein an internal power supply circuit is formed in said semiconductor chip,
wherein said plurality of first bonding electrodes include a fourth bonding electrode to which an internal power voltage generated by said internal power supply circuit is applied,
wherein said plurality of electrodes include a third electrode and a fourth electrode constituting a third row positioned inside said second row within said second main surface and electrically connected to said fourth bonding electrode via said first wires,
wherein said third electrode is electrically connected to said internal power supply circuit and supplies said internal power voltage to said fourth bonding electrode via said first wires, and
wherein said fourth electrode is supplied with said internal power voltage via said third electrode, said first wires and said fourth bonding electrode.

5. The semiconductor device according to claim 1,
wherein an area of said first electrodes is greater than an area of said second electrodes.

6. The semiconductor device according to claim 1,
wherein a logic IC or an ASIC containing said logic IC is formed over said semiconductor chip.

7. A semiconductor device comprising:
a wiring board having a first main surface and a first back surface, wherein said first main surface is provided with a chip mounting area in its central part, a plurality of ring-shaped first bonding electrodes are formed in a first area surrounding said chip mounting area, a plurality of second bonding electrodes are formed in a second area surrounding said first area, and wiring for electrically connecting said first bonding electrodes with said second bonding electrodes is formed inside;

a semiconductor chip having a second main surface and a second back surface, wherein said second back surface is so mounted over said wiring board as to be in contact with said chip mounting area and a plurality of electrodes are arranged over said second main surface; and a plurality of wires for electrically connecting said plurality of electrodes to respectively matching ones of said first bonding electrodes or said second bonding electrodes, wherein said plurality of first bonding electrodes are electrically connected to a power supply potential or a reference potential, wherein said plurality of second bonding electrodes are used for inputting or outputting signals, wherein said plurality of electrodes are arrayed in a plurality of rows along an outer circumference of said second main surface, and said electrodes included in a first row and said electrodes included in a second row positioned inside said first row within said second main surface are arranged in a zigzag pattern in a direction along said outer circumference of said second main surface, wherein said plurality of electrodes include a plurality of first electrodes electrically connected to said first bonding electrodes and a plurality of second electrodes electrically connected to said plurality of second bonding electrodes, and wherein said plurality of wires are connected between one of said first electrodes and said first bonding electrodes.

8. The semiconductor device according to claim 7,
wherein said plurality of first electrodes are included in said first row,
wherein an odd number of said second electrodes are arranged between adjoining ones of said first electrodes in the direction along said outer circumference of said second main surface.

9. The semiconductor device according to claim 7,
wherein a third bonding electrode electrically connected to the reference potential is formed in said chip mounting area of said first main surface of said wiring board, and
wherein, of said plurality of first bonding electrodes, those arranged innermost are formed integrally with said third bonding electrode.

10. The semiconductor device according to claim 7,
wherein an internal power supply circuit is formed in said semiconductor chip,
wherein said plurality of first bonding electrodes include a fourth bonding electrode to which an internal power voltage generated by said internal power supply circuit is applied,
wherein said plurality of electrodes include a third electrode and a fourth electrode constituting a third row positioned inside said second row within said second main surface and electrically connected to said fourth bonding electrode via said first wires, wherein said third electrode is electrically connected to said internal power supply circuit and supplies said internal power voltage to said fourth bonding electrode via said first wires, and wherein said fourth electrode is supplied with said internal power voltage via said third electrode, said first wires and said fourth bonding electrode.

11. The semiconductor device according to claim 7, wherein an area of said first electrodes is greater than an area of said second electrodes.

12. The semiconductor device according to claim 7, wherein a logic IC or an ASIC containing said logic IC is formed over said semiconductor chip.

* * * * *